(12) United States Patent
Yu

(10) Patent No.: US 6,281,705 B1
(45) Date of Patent: Aug. 28, 2001

(54) POWER SUPPLY MODULE IN INTEGRATED CIRCUITS

(75) Inventor: Ho-Yuan Yu, Saratoga, CA (US)

(73) Assignee: Lovoltech, Inc., Santa Clara, CA (US)

(*) Notice: Subject to any disclaimer, the term of this patent is extended or adjusted under 35 U.S.C. 154(b) by 0 days.

(21) Appl. No.: 09/453,141

(22) Filed: Dec. 2, 1999

Related U.S. Application Data (60) Provisional application No. 60/111,865, filed on Dec. 11, 1998.

(51) Int. Cl.[7] .................................................. H02M 3/18
(52) U.S. Cl. .................................. 326/68; 326/81; 363/59; 363/60; 363/62; 257/256; 257/274; 257/287
(58) Field of Search .................................. 326/80, 81, 68; 257/256, 274, 287; 363/59, 60, 62

(56) References Cited

U.S. PATENT DOCUMENTS 5,581,454 * 12/1996 Collins ..................................... 363/59
6,169,673 * 1/2001 McIntyre et al. ....................... 363/59

OTHER PUBLICATIONS

Performance Limits of Switchesd–Capacitor DC–DC Converters, Mark S. Makowski, IEEE 1995.*

* cited by examiner

Primary Examiner—Michael Tokar
Assistant Examiner—Vibol Tan
(74) Attorney, Agent, or Firm—Wagner, Murabito & Hao LLP

(57) ABSTRACT

This invention discloses the concept of the integration of the four terminal switcher and the capacitor pairs for the DC to DC converter or power supplier. This invention can be built by IC process as the DC to DC converter or power supply alone or used as power supply or converter module or block for distributed power in the System-on-Chip. This invention discloses the basic structure of the DC to DC converter or power supply module on standard CMOS IC process and on SOI substrates. This basic structure of the DC to DC converter or power supply module provides high current and low voltage applications for future generations of ICs.

18 Claims, 8 Drawing Sheets

Switching Capacitors, Step-Down Configuration

Four-terminal Switcher

Figure 1 Switching Capacitors, Step-Down Configuration

Figure 2 Four-terminal Switcher

Figure 3 Cross Section of Four Terminal Switcher In CMOS IC Process

Figure 4 Power Supply Module in ICs

Figure 5 Cross Section of Four Terminal Switcher and Capacitor

Figure 6 Four Terminal Switcher in SOI Structure

Figure 7 Four Terminal Switcher in SOI Structure

Figure 8 Four Terminal Switcher in SOI Structure

POWER SUPPLY MODULE IN INTEGRATED CIRCUITS

This Application claims a Priority Date of Dec. 11, 1998, benefited from a previously filed Provisional Application No. 60/111,865 by the same Inventor of this Patent Application.

BACKGROUND OF THE INVENTION

1. Field of the Invention

This invention relates to the complete power supplier or DC to DC converter that is built by Integrated Circuits (IC) process. This invention can be used as the add-on module or embedded power supply for the System-on-Chip ICs. This invention discloses four-terminal switchers integrated with built-in capacitors by providing step-down or step-up DC to DC conversions by switching capacitors method.

2. Description of the Prior Art

The concept of switching capacitors for power conversion was one of the original concepts for the energy conversion. However, due to unavailability of very low on resistance and low cost semiconductor switcher, this approach has not been realized for the electronic equipment. Most of the power suppliers and DC to DC converters available today are using transformers, inductors, and capacitors for the energy conversion in conjunction with rectifiers, MOS transistors, bipolar transistors and/or integrated circuits. Marek S. Makowski et al published an article, "Performance Limits of Switched-Capacitor DC-DC Converters", P. 249, Power Electronics Technology and Applications, Edited by Dr. Fred C. Lee, IEEE TK7881.15, 1997. In this article, theoretical performance limits of switching capacitor DC-DC converter are calculated. It is clearly indicated in this article that the overall efficiency of the converter is a function of the contact resistance of the switcher. A contact resistance of 2 ohms was used in the calculation; therefore, the low efficiency of this kind of converter is resulted. No structure or description of the switcher is discussed in this article. The inventor, Ho-Yuan Yu, has submitted several patent ideas to patent office: 1) "Low On Resistance Transistors and the Method of Making", Filed in Patent Office of Disclosed Document Program, Sep. 24, 1998, #444899. It disclosed low on resistance Junction Field Effect Transistor (JFET) device structure and the fabrication steps for normally "on" JFETs. 2) "Novel Structure of JFETs for Low Voltage Applications, Filed in Patent office of the Disclosed Document Program, Sep. 16, 1998, #444874. This is a normally "off" or enhancement mode Junction Field Effect Transistors (JFETs) to provide low on resistance in "on" state. Above two patent concepts have been combined and filed under Provisional Application No. 60/115,009 of Jan. 6, 1999. The utility application of above patent was filed on Oct. 28, 1999. 3) "Switcher for Switching Capacitors, Filed in Patent office of the Disclosed Document Program, Nov. 30, 1998 and filed Provisional Application No. 60/111,625 of Dec. 9, 1998.

Based on above disclosures, this patent application is to integrate above device structures with the built-in capacitors in the IC to form the embedded power supply that can be made by CMOS IC process. It also can be used as the module or block along with standard integrated circuits for the System-on-Chip ICs.

SUMMARY OF THE PRESENT INVENTION

This invention comprises pairs of four-terminal switchers in conjunction with the built-in capacitors to provide step-down or step-up DC to DC converters or power suppliers. The switcher is comprised as a four-terminal device with a control gate. The switchers provide the function of connecting an array of capacitors in series configuration during charging and in parallel configuration during discharging for step-down power conversion. In the similar principle, this switcher connects an array of capacitors in parallel configuration during charging and in series configuration during discharging, a step-up function is provided. The switcher is using normally "off" Junction Field Effect Transistors (JFETs) or enhancement mode JFETs with N-channel and P-channel structure. The detail structure of this switcher is disclosed in Patent Office of Disclosed Document Program mentioned earlier.

The four terminal switchers are built in the isolated N-well (or P-well depending on the process). The capacitors are built between, on the side, or on the top of the switcher by using trench or stacked-up structures. Therefore, the built-in power supplier or DC to DC converter blocks can be readily implemented into the system.

DETAIL DESCRIPTION OF THE PREFERRED EMBODIMENT

Figure 1:
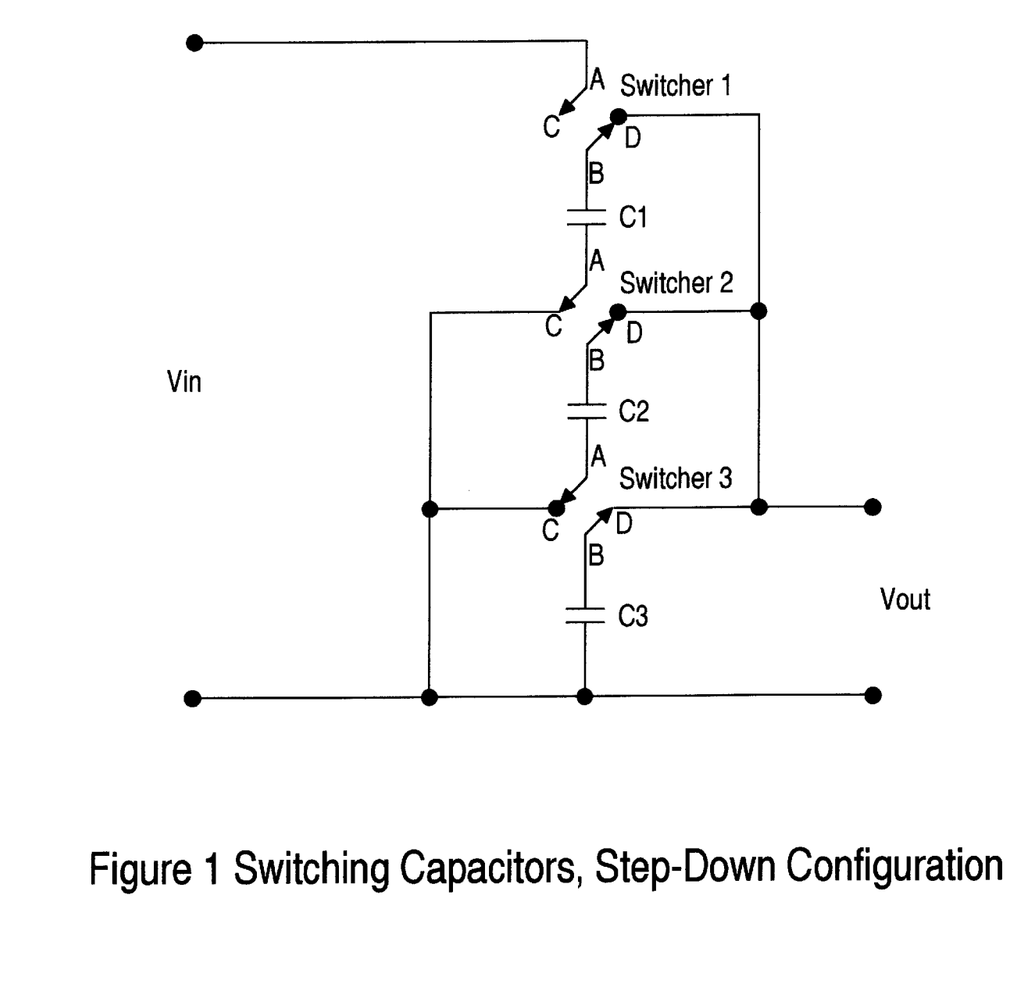
FIG. 1 illustrates the switching capacitors for step down configuration.

FIG. 1 illustrates the switching capacitors for step-down configuration. An array of capacitor-switcher pairs, two, three, four, five or more are applicable to this application. This Figure demonstrates three capacitors and three switchers as an example. Capacitors C1, C2, and C3 with the same capacitance value are assumed. When the switcher connects A to B, the capacitors are in series connection. The voltage across each capacitor is about one third of the input voltage after they are fully charged. When the switcher connects A to C and B to D, the capacitors C1, C2, and C3 are in parallel connection. The voltage at output, Vout is the same voltage as C1, C2, and C3. Therefore, the output voltage is about one third of input voltage. However, the current delivered to the output circuitry is about three times of current at input current. Similar configuration can be made for the step-up power supplier or DC to DC converter.

Figure 2:
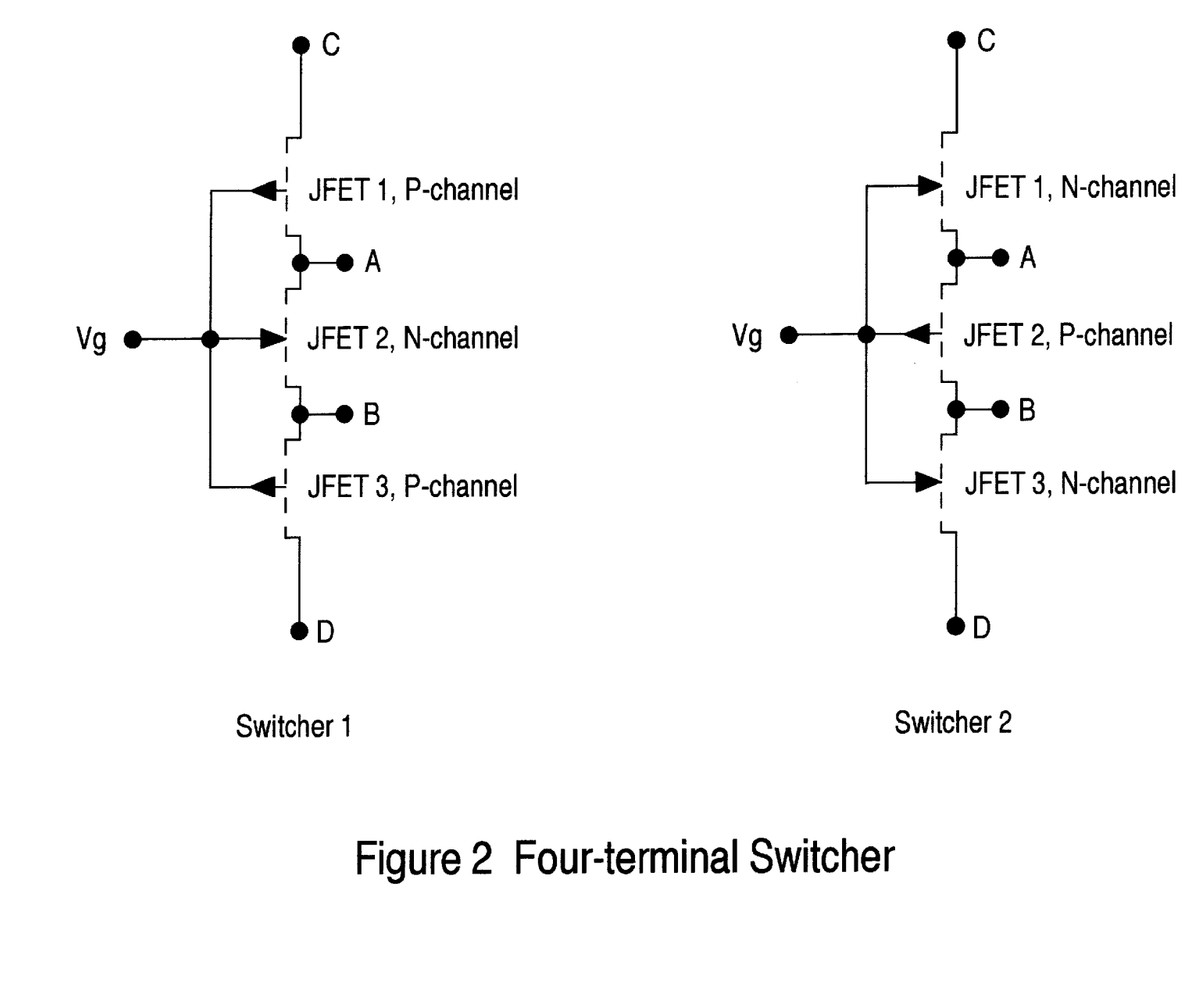
FIGS. 2A and 2B illustrate the structure of four-terminal switchers.

FIG. 2 illustrates two kinds of four-terminal switchers. In the first case, two P-channel and one N-channel normally "off" or enhanced mode JFETs are connected in series with all gates connected together. The threshold voltage for each normally "off" JFET is around 0.3V and the gate voltage Vg is ranging approximately from −0.5V to +0.5V. The gate turns the JFETs on when the gate in the forward bias above threshold voltage respect to the JFET's source and drain.

The voltage drop between the source and drain of each JFET can be as low as 0.1V or much lower. In the first case of switcher 1, when the gate is above +0.3V, the middle JFET 2 (N-channel) turns on and the terminals A and B are connected. The upper JFET 1 (P-channel) and the lower JFET 3 (P-channel) are both at "off" state. As the gate voltage is below +0.3V, the middle JFET 2 disconnects the terminals A and B. When the gate voltage is between +0.3V and −0.3V, all three JFETs are at "off" state. The array of capacitors is ready to be connected to next configuration. Until the gate voltage is more negative than −0.3V, the upper JFET I (P-channel) and lower JFET 3 (P-channel) in forward bias between the gate and source/drain are turned on. In this condition, terminal A connects to terminal C and terminal B connects to terminal D. Similar principle is applied to switcher 2. The threshold voltage of the normally "off" JFETs is chosen between 0.2V to 0.3V in order for the device to be operated up to 200 degree C.

Figure 3:
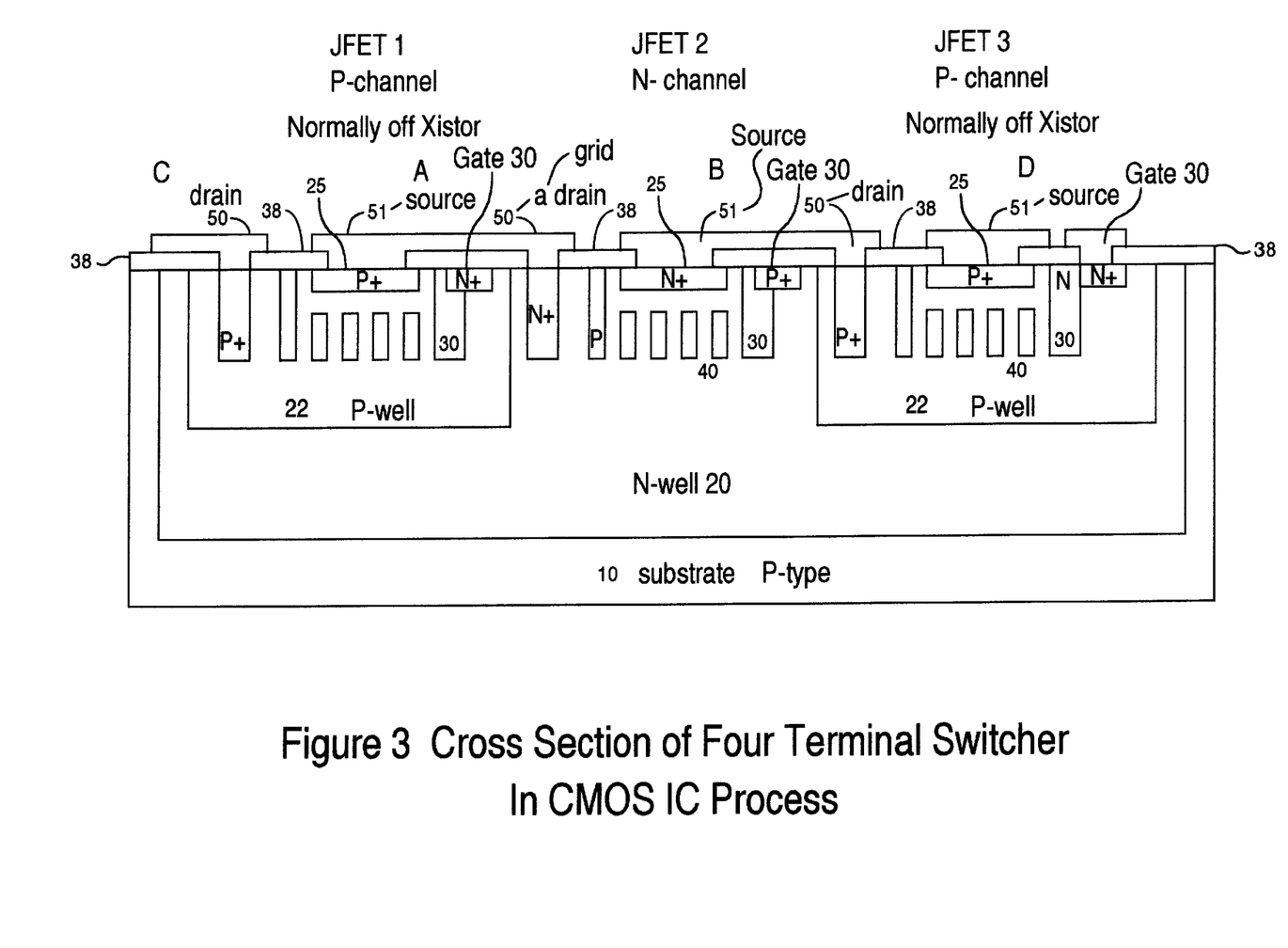
FIG. 3 shows the cross section of the four terminal switcher built in CMOS IC process.

FIG. 3 shows a cross section of four-terminal switcher that can be processed along with standard CMOS ICs. For example, the substrate 10 is normally a P-type material. N-well 20 is a deep well of standard CMOS ICs. P-well 22 for two normally "off" P-channel JFETs within the N-well are a shallower structure. The gate grid 30 of the N-channel normally "off" JFET is P-type polarity. The gate grid 30 can be made either by implant/diffusion, trench process, or double epitaxial process. For N-channel device, the source and drain are attached to the heavily doped N+layer 25. Source 51 is connected to layer 25 and it is located on the top of the gate grid 30. Drain 50 is located at the side of the gate grid 30 and connected to another N+layer 25. The P-channel device is formed in similar way with opposite doping polarity. By connecting drain 50 of N-channel JFET 2 to the source 51 of P channel JFET 1 at the left side forms the terminal A. Connecting source 51 of the N-channel JFET 2 to the drain 50 of P-channel JFET 3 at the right side forms terminal B. Terminal C is the drain 50 of the P-channel JFET 1 at left and Terminal D is the source 51 of the P-channel JFET 3 at right. Thus this switcher with four-terminal A, B, C, and D plus the control gate is illustrated. The gate grids 30 of these three devices are connected together to the top of the surface at the side of the chip. Terminal A, B, C, and D are formed by metallization process separated by oxide layer 38. When a small AC signal (for example, +/−0.5V) is applied to the gate, the integrated device switches the terminals A, B, C, and D according to the function described in FIGS. 1 and 2. In more detail description, when the gate voltage is in positive polarity and larger than the threshold voltage Vt of N-channel JFET, this device is turned-on. The opened width of the conduction channels depending on the forward bias between the gate grid and source and drain. Thus this N-channel JFET is turned-on and current flows between the source and the drain. When the gate voltage swings to lower than threshold voltage, the N-channel device is closed, the current stops flow between the source and the drain. In this situation, all three JFETs are at "off" state. As the gate voltage swings to negative polarity and similar action turns on the other two JFETs.

The width W 40 is the distance between the gate grid that is determined by the lithography pattern and the thermal cycle after implant. This width W 40 and the doping concentration in the conduction channel determine the threshold voltage Vt. Since P-well is located within the N-well, the doping concentration in P-well is higher than the N-well, thus the W 40 in P-well is smaller than in N-well for the similar threshold voltage.

Figure 4:
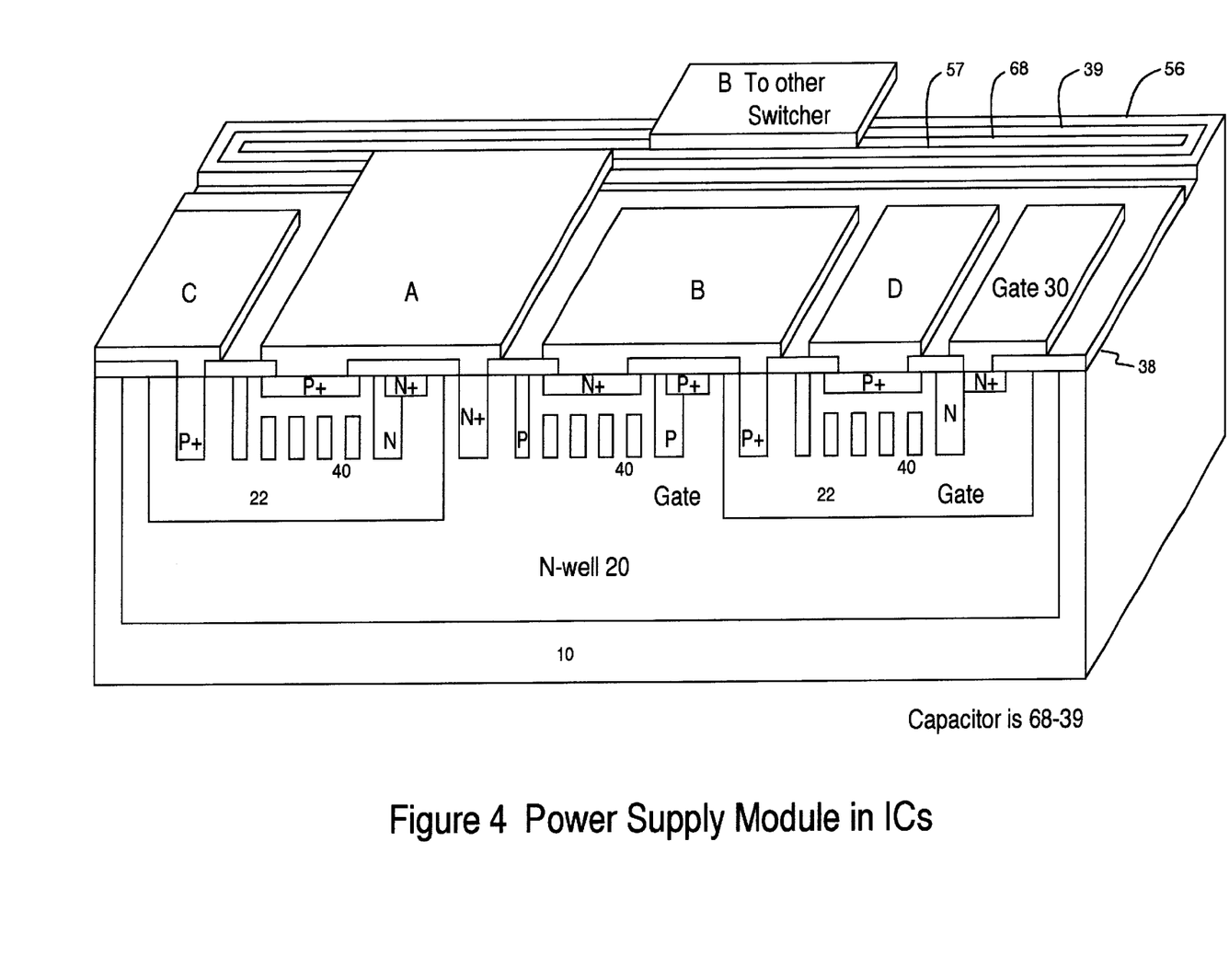
FIG. 4 shows the structure of power supply module in ICs by integrating capacitors into switcher.

FIG. 4 illustrates the structure of the switcher shown in FIG. 3 plus the capacitor built by the trench process. This is a switcher-capacitor pair. In order to do step-down or step-up energy conversion, more than one pair is required. The trench capacitor is built by the trench etch. Then the oxide layer is grown by thermal oxidation. A thin conductive layer of material 56 such as polycrystalline silicon is deposited into the trench. The oxidation process is used to form the capacitor oxide 68. High dielectric constant material such as TiO2 or other materials can also be deposited into the trench. After the completion of dielectric material 68 formation, the doped polycrystalline silicon 57, CVD or plated metal can be deposited into the trench followed by the etch back/planarization process. The terminal A is connected to the outer plate 56 of the capacitor and the terminal B of other switcher is connected to the inner plate 57 of the capacitor. The low voltage oscillator (+/−0.5V to +/−0.75V) is connected to the gate (not shown in this figure) for the controlling of the switching speed or frequency of the power supply module. A current limit device such as a JFET without gate can be built into the chip to limit the gate current for the protection of the gate against voltage over-shoot.

Figure 5:
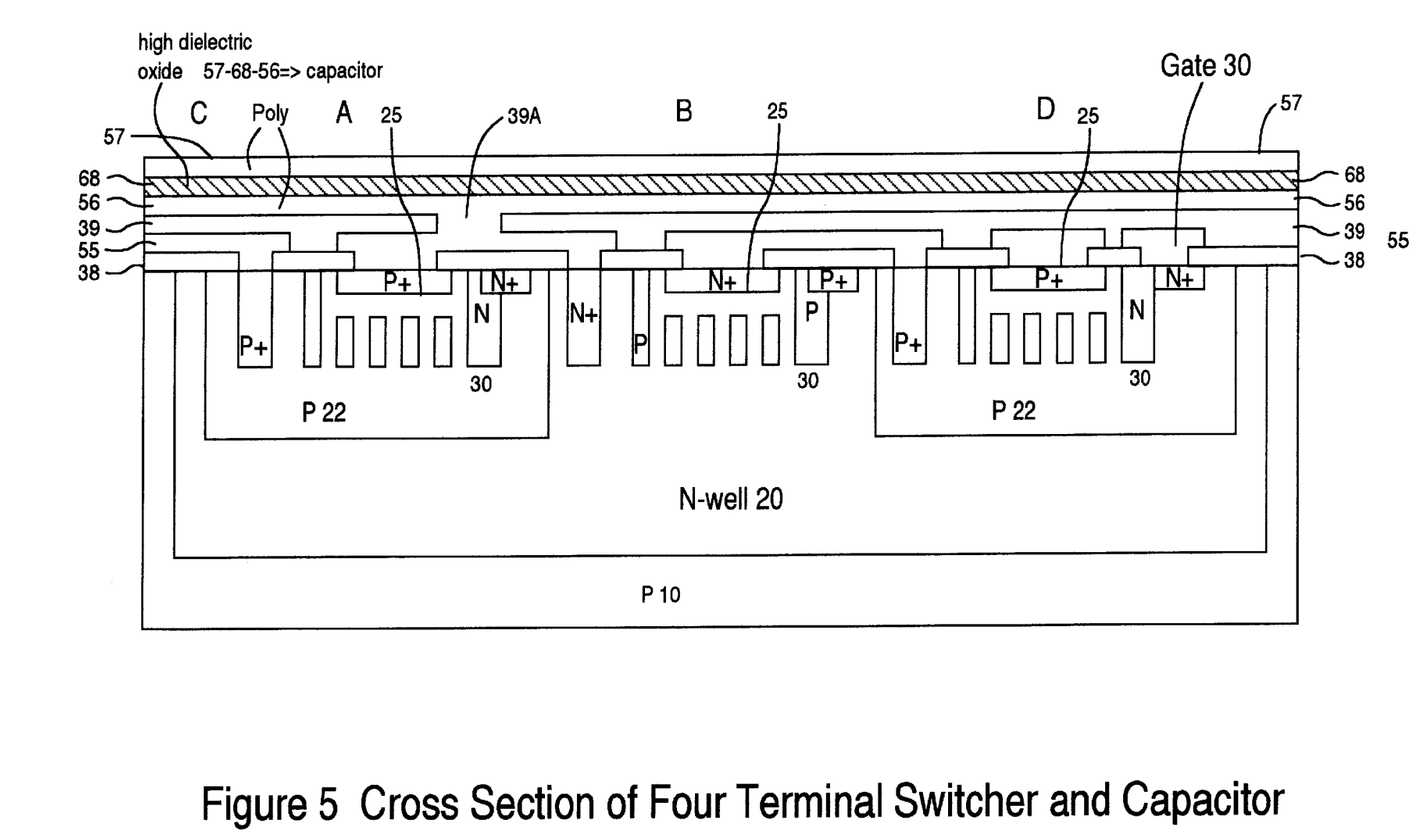
FIG. 5 illustrates the capacitor to be built on the top of the switcher.

FIG. 5 is the cross section of the power supply module with the capacitor built on the top of the switcher. After completing the device construction of FIG. 3, an oxide layer 39 such as silicon dioxide is deposited on to the top surface of terminals A, B, C, and D and the gate. Via etch is use to make the via contact 39A for the following metal layer 56. Then a metal layer 56 is deposited on the top of the oxide as the first plate of the capacitor. The capacitor dielectric material 68 is deposited on to the first capacitor plate 56. This material 68 can be the silicon dioxide or other high dielectric constant material such as TiO2, etc. The top plate 57 is a metal material deposited on to the surface of the capacitor dielectric material 68. This top plate 57 is connected to the B terminal of other switcher. This kind of process is similar to IC's multiple layer metallization process. No extra silicon real estate is required for the stack-up capacitors.

Figure 6:
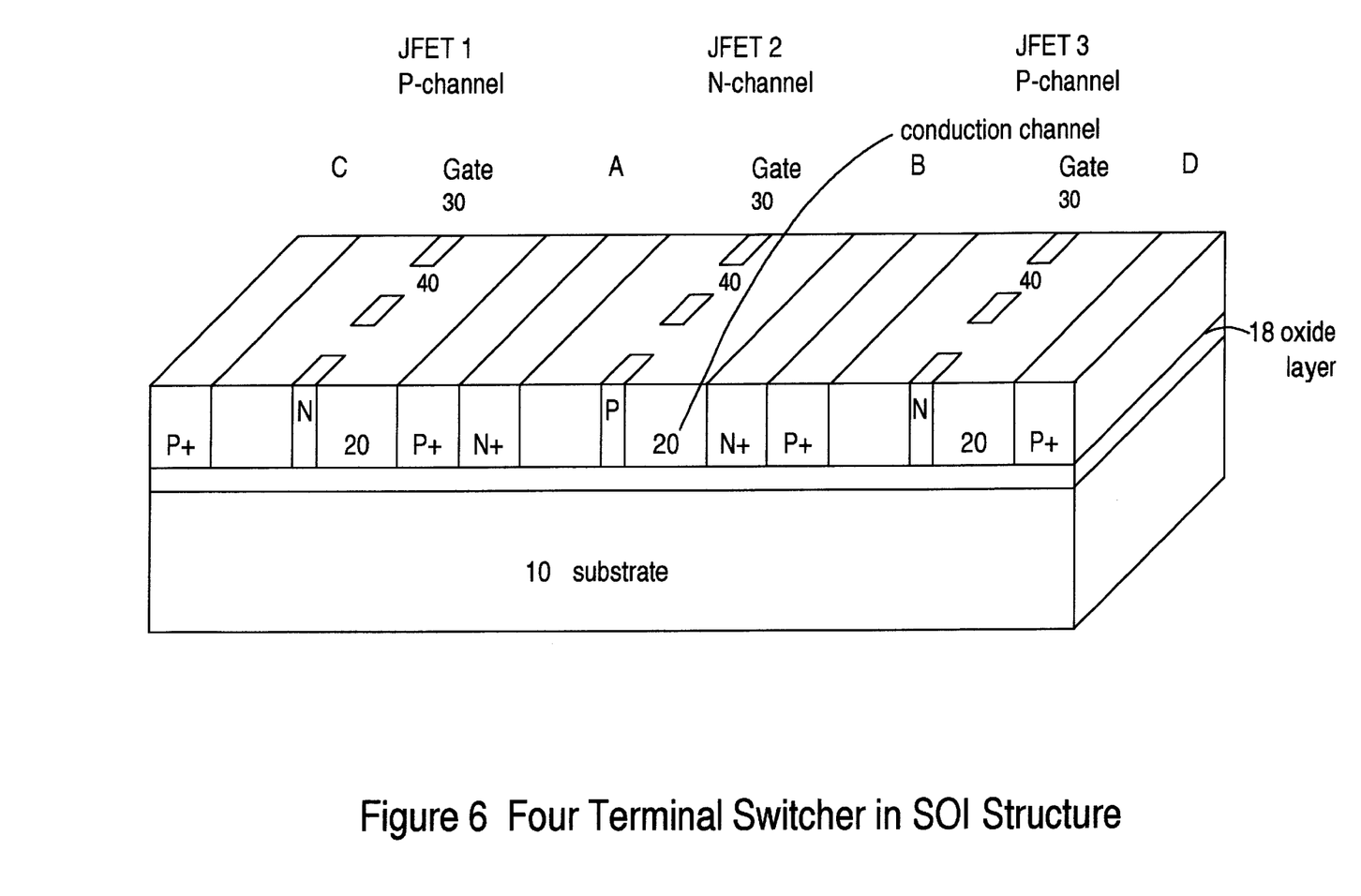
FIG. 6 shows a four-terminal switcher in SOI structure.

FIG. 6 shows the four-terminal switcher built in SOI structure. SOI is a silicon on insulator structure. It can be produced by: 1) deep oxygen ion implant, 2) bonding of two wafers with an oxide layer in between at high temperature followed by etch back and polished, or 3) depositing thick polysilicon on to the oxide surface of a silicon wafer, etch back the silicon wafer to desired thickness or by chemical and mechanical lapping and polishing methods. SOI is an excellent structure for device isolation and it gives more freedom for device design and construction. The substrate 10 is used forth mechanical support. The interlayer oxide 18 is provided for dielectric isolation. The thickness of this oxide layer 18 can be between 1000 A to over 2 microns depending on the application. The heavily doped source 51, drain 50, and the gate 30 can be done by implant method with masked patterns. The gate structure 30 is constructed in vertical version as shown in this Figure. The width W 40 is determined by lithography process and the thermal process followed by the implant. The threshold voltage Vt of the device is determined by the width W 40 and the doping concentration of the base layer 20. This is the basic structure of a four terminal switcher built on SOI substrate.

Figure 7:
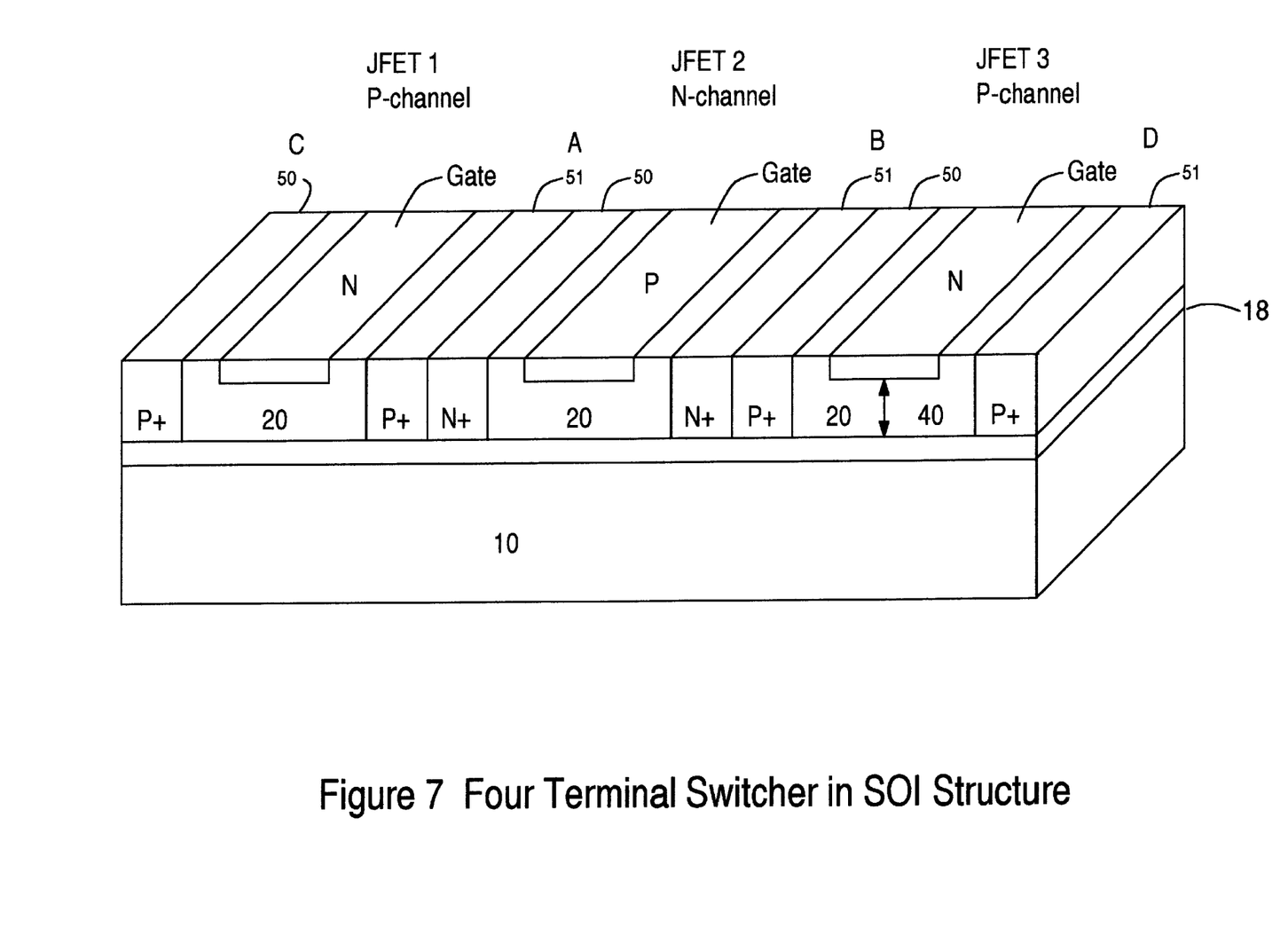
FIG. 7 discloses an alternative structure by placing the gate on the top of conduction channel.

FIG. 7 illustrates four-terminal switcher in SOI structure with the gate on the top of the conduction channel 20. This Figure is similar to FIG. 6 except that the gate 30 is done by shallow implant on the top of the conduction channel 20 and between the source 51 and drain 50. The width, W 40, is determined by the thickness of the base material 20 and the implant depth of the gate 30. The threshold voltage Vt is determined by the width W and the doping concentration of the base layer 20.

Figure 8:
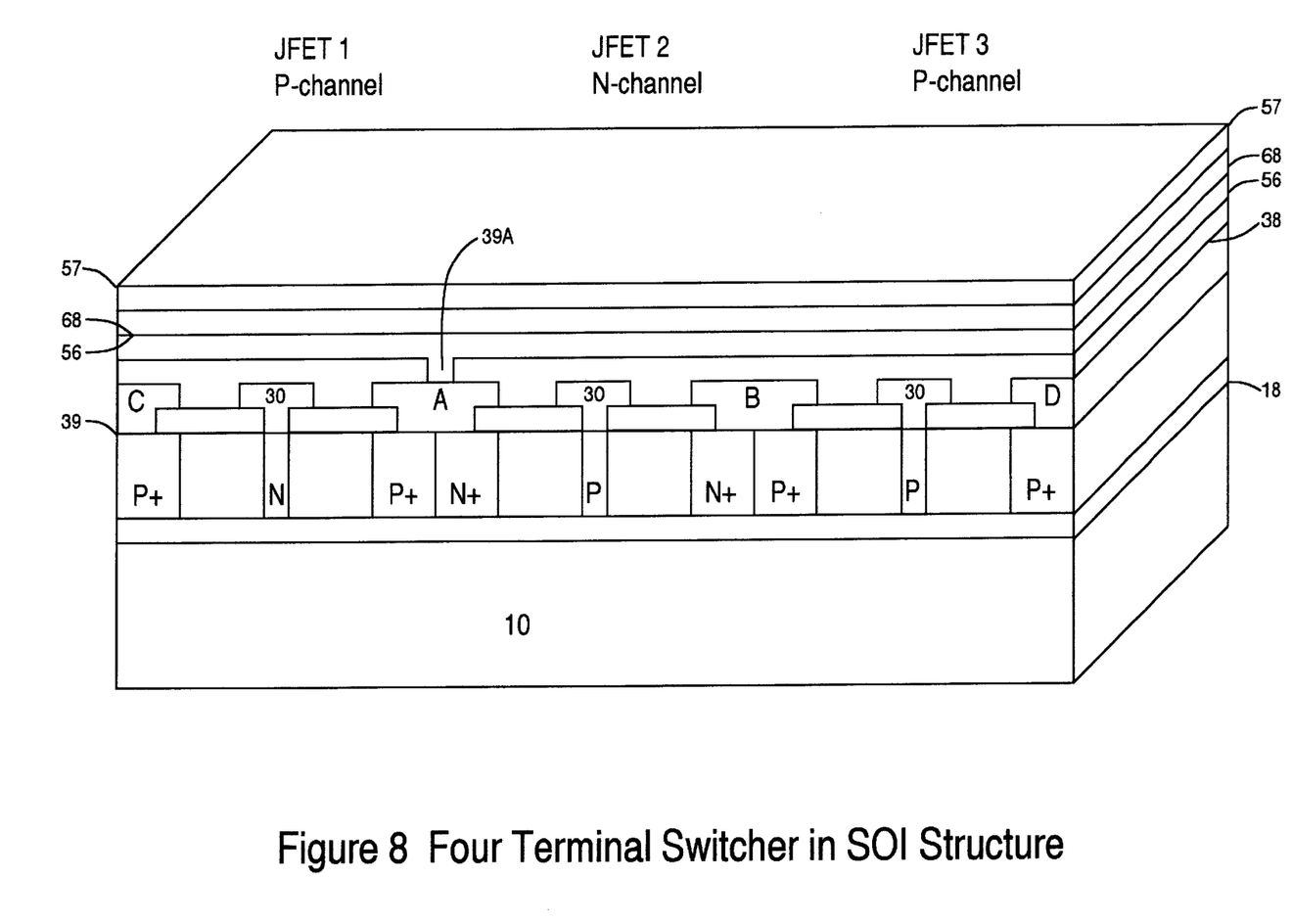
FIG. 8 illustrates the complete power supplier module with capacitor built on the top of switcher (FIG. 6) in SOI structure.

FIG. 8 shows the four-terminal switcher in SOI structure integrated with the capacitor on the top of the switcher as shown in FIG. 6. The capacitor dielectric material 68 can be thermally grown SiO2, deposited SiO2, or the deposited high dielectric constant material such as TiO2, etc. The bottom plate 56 of the capacitor is connected to the terminal A of this switcher through via hole 39A and the top plate 57 of the capacitor is connected to the terminal B of other switcher (not shown here). This forms a switcher-capacitor pair. Multiple pairs are used for step-down or step-up DC to DC converters. An oscillator with low bias voltage around +/−0.5V is connected to the gate 30 (not shown) to perform the switching function of the converter.

What is claimed is:

1. A semiconductor chip comprising:
   logic for performing electrical operations;
   a plurality of normally off junction field effect transistors coupled to the logic;
   a signal generator coupled to the plurality of normally off junction field effect transistors which generates a control signal applied to the gates of the normally off junction field effect transistors, the control signal controlling the switching on and off of the plurality of normally off junction field effect transistors;
   a plurality of capacitors coupled to the plurality of normally off junction field effect transistors, the capacitors being charged and discharged according to the switching of the plurality of normally off junction field effect transistors, wherein the plurality of normally off junction field effect transistors, the signal generator, and the plurality of capacitors are fabricated from a same die.

2. The semiconductor chip of claim 1, wherein the plurality of normally off junction field effect transistors include four terminals.

3. The semiconductor chip of claim 1, wherein the plurality of normally off junction field effect transistors comprise:
   a first N-channel normally off junction field effect transistor;
   a second P-channel normally off junction field effect transistor;
   a third P-channel normally off junction field effect transistor.

4. The semiconductor chip of claim 1, wherein the plurality of normally off junction field effect transistors comprise:
   a first P-channel normally off junction field effect transistor;
   a second N-channel normally off junction field effect transistor;
   a third N-channel normally off junction field effect transistor.

5. The semiconductor chip of claim 1 further comprising a current limit device which is fabricated onto a same substrate as that of the plurality of normally off junction field effect transistors.

6. The semiconductor chip of claim 1, wherein the plurality of normally off field effect transistors include P-channel and N-channel enhancement mode transistors.

7. The semiconductor chip of claim 1, wherein the plurality of normally off field effect transistors are comprised of a silicon on insulator structure.

8. The semiconductor chip of claim 1, wherein the plurality of junction field effect transistors have a threshold voltage of approximately 0.3 volts.

9. The semiconductor chip of claim 1, wherein the plurality of junction field effect transistors have a gate voltage ranging approximately from −0.5 volts to +0.5 volts.

10. The semiconductor chip of claim 1, wherein the plurality of junction field effect transistors comprise:
    a P-type substrate;
    an N-well formed within the P-type substrate which is used to form a normally off N-channel JFET;
    a first P-well formed within the N-well which is used to form a first normally off P-channel JFET;
    a second P-well formed within the N-well which is used to form a second normally off P-channel JFET.

11. The semiconductor chip of claim 10, wherein one of the plurality of capacitors is comprised of:
    a first metal layer deposited on top of a plurality of terminals and gates of the plurality of normally off junction field effect transistors;
    a dielectric oxide layer deposited on top of the first metal layer;
    a second metal layer deposited on top of the dielectric oxide layer.

12. An embedded power supply, comprising:
    a plurality of normally off junction field effect transistors coupled to an input voltage source, wherein the plurality of normally off junction field effect transistors comprise:
    a) a substrate;
    b) a gate structure surrounded by a depletion region;
    c) a first electrode and a second electrode disposed such that the depletion region does not allow current to flow between the first electrode and the second electrode when the gate is not forward biased and the gate structure is operable to effect the depletion region to conduct current between the first electrode and the second electrode when the gate structure is forward biased;
    a signal generator coupled to the plurality of normally off junction field effect transistors which generates a control signal applied to the gate structure of the normally off junction field effect transistors, the control signal controlling the switching on and off of the plurality of normally off junction field effect transistors.

13. The embedded power supply of claim 12 further comprising:
    a plurality of capacitors coupled to the plurality of normally off junction field effect transistors, the capacitors being charged and discharged according to the switching of the plurality of normally off junction field effect transistors.

14. The embedded power supply of claim 13, wherein the plurality of normally off junction field effect transistors, the signal generator, and the plurality of capacitors share the same substrate.

15. An embedded power supply, comprising:
    a plurality of normally off junction field effect transistors coupled to an input voltage source, wherein at least one of the plurality of normally off junction field effect transistors comprise:
    a) a P-type substrate;
    b) an N-well formed within the P-type substrate;
    c) a plurality of source and drain region pairs disposed within the N-well and extending within the P-type substrate, wherein each source and drain region pair is separated by an N-well channel region having a control gate layer disposed thereon and having depletion regions coupling together and the drain regions having drain metal contacts;

d) a gate contact P+ region disposed between the P-type substrate and a gate metal contact and coupling with the control gate layer, the gate contact operable to cause the depletion regions to open current path between each source and drain region pair provided the gate contact is forward biased and also for restrictin current flow when the gate contact is zero biased.

16. The embedded power supply of claim 15 further comprising:

a plurality of capacitors coupled to the plurality of normally off junction field effect transistors, the capacitors being charged and discharged according to the switching of the plurality of normally off junction field effect transistors.

17. An embedded power supply, comprising:

a plurality of normally off junction field effect transistors coupled to an input voltage source, wherein at least one of the plurality of normally off junction field effect transistors comprise:

a) a P-type substrate;
b) an N-well formed within the P-type substrate;
c) a plurality of source and drain region pairs disposed within the N-well and extending within the P-type substrate, wherein each source and drain region pair is separated by an N-well channel region having a control gate layer disposed thereon and having depletion regions coupling together and the drain regions having drain metal contacts;
d) a gate contact P+ region disposed between the P-type substrate and a gate metal contact and coupling with the control gate layer, the gate contact operable to cause the depletion regions to open current path between each source and drain region pair provided the gate contact is forward biased and also for restrictin current flow when the gate contact is zero biased.

18. The embedded power supply of claim 12 further comprising:

a plurality of capacitors coupled to the plurality of normally off junction field effect transistors, the capacitors being charged and discharged according to the switching of the plurality of normally off junction field effect transistors.

* * * * *